United States Patent [19]

Dykaar et al.

[11] Patent Number: 5,012,319
[45] Date of Patent: Apr. 30, 1991

[54] INTEGRATED ELECTRONIC ASSEMBLY COMPRISING A TRANSMISSION LINE

[75] Inventors: Douglas R. Dykaar, Gillette; Anthony F. J. Levi, Summit, both of N.J.

[73] Assignee: AT&T Bell Laboratories, Murray Hill, N.J.

[21] Appl. No.: 523,093

[22] Filed: May 14, 1990

[51] Int. Cl.$^5$ .................... H01L 29/06; H01L 23/48; H01L 29/80; H01L 39/12
[52] U.S. Cl. ........................ 357/55; 357/65; 357/68; 357/22; 505/703; 505/873
[58] Field of Search .................. 357/55, 22, 65, 68, 357/41; 505/780, 873, 703

[56] References Cited

PUBLICATIONS

*Semiconductor International*, Sep. 1990, p. 38 by Iscoff.
"Microstrip Lines and Slotlines", by K. C. Gupta et al., *Artech House, Inc.*, 1979, pt. 65.
"Theoretical and Experimental Characterization of Nonsymmetrically Shielded Coplanar Waveguides for Millimeter-Wave Circuits", by F. Alessandri et al., *IEEE Transactions on Microwave Theory and Techniques*, vol. 37, No. 12, Dec. 1989, pp. 2020–2027.
"40 GHz Measurement on InP/Air Gap Line by Picosecond Electro-Optic Sampling", by S. Loualiche, *Electronics Letters*, vol. 26, No. 4, Feb. 15, 1990, pp. 266–267.
"Development of 18 GHz GaAs Static Frequency Dividers and Their Evaluation by Electrooptic Sampling", by F. F. Jensen et al., Picosecond Electronics and Optoelectronics II, Proceedings of the Second OSA-IEEE (LEOS) Incline Village, Nevada, Jan. 14–16, '87, pp. 184–187.

*Primary Examiner*—Mark Prenty
*Attorney, Agent, or Firm*—E. E. Pacher

[57] ABSTRACT

Integrated electronic assemblies according to the invention, typically semiconductor IC chips, comprise an air gap transmission line. The line has high propagation speed and low dispersion, and can be readily manufactured. Various embodiments of the inventive transmission line are disclosed. In all cases the semiconductor substrate is etched so as to remove at least a substantial portion of the semiconductor material under and/or adjacent to the conductor line or lines. Insulator material (e.g., $SiO_2$) serves, inter alia, to support the conductor.

8 Claims, 4 Drawing Sheets

INTEGRATED ELECTRONIC ASSEMBLY COMPRISING A TRANSMISSION LINE

FIELD OF THE INVENTION

This invention pertains to integrated electronic assemblies, typically semiconductors ICs. More particularly, it pertains to such assemblies that comprise means for conducting an electrical signal from one part of the assembly to another part thereof.

BACKGROUND OF THE INVENTION

Electrical signals are conventionally propagated from one part of a given semiconductor IC chip to another part thereof by means of metal lines on an insulator, the latter in turn typically being in contact with (and supported by) insulator on semiconductor material. Signal propagation on such conventional lines is relatively slow, due at least in part to the relatively high dielectric constant of semiconductor material.

The relatively slow signal propagation speed on conventional transmission lines is becoming a significant problem, at least in very fast (e.g., picosecond) integrated electronic assemblies. For example, a 50 Gbit/sec data rate exemplarily requires a 50 GHz clock signal and its complement, which can be distributed less than 1 mm (using metal lines of GaAs) before timing errors between devices become important.

It is well known that air has a very low dielectric constant, essentially the same as that of vacuum. Thus, the signal propagation speed on a conductor that is configured such that essentially no field lines that originate or terminate on the conductor enter a dielectric other than air would be approximately equal to the speed of light in vacuum, the highest possible signal propagation speed.

A further important aspect of high frequency intra-chip signal transmission is dispersion, especially dispersion associated with the presence of higher order modes. It is known that higher order modes in microstrip lines typically are strongly associated not with the conductive strip but with the dielectric-air interface. See, for instance, *Microstrip Lines and Slotlines*, K. C. Gupta et al., Artech House, Inc., Washington 1979, p. 65.

Waveguides comprising a conductor strip supported within a conductive housing are known. See, for instance, F. Alessandri et al., *IEEE Transactions on Microwave Theory and Techniques*, Vol. 37(12), pp. 2020–2027. See also S. Loualiche et al., *Electronics Letters*, Vol. 26(4), pp. 266–267, wherein is disclosed a non-integrated microwave assembly that comprises an air gap stripline on an InP substrate. However, such waveguides clearly can not be produced by conventional semiconductor manufacturing techniques and can not readily be integrated into a semiconductor IC chip. They thus are not suitable as intrachip conductors.

The prior art also knows so-called airbridges that are typically used to reduce parasitic capacitance between two conductor lines. See, for instance, the paper by J. F. Jensen et al., in *Picosecond Electronics and Optoelectronics II*, F. J. Leonberger et al., editors, Springer Verlag 1987, pp. 184–187. Such airbridges typically constitute only a minor portion of the total length of a conductor line and clearly introduce an undesirable dielectric constant discontinuity into the transmission path.

In view of the relatively low signal propagation speed associated with prior art intra-chip conductors, it would clearly be very desirable to have available an integrated electronic assembly that comprises intra-chip conductor means that support signal propagation speeds substantially in excess of those associated with conventional prior art conductors, that are substantially free of dielectric discontinuity, and that preferably are of a geometry that is relatively free of field lines that cross an air-dielectric interface, such that generation of higher order modes is relatively low. This application discloses such assemblies.

SUMMARY OF THE INVENTION

In a broad aspect the invention is an integrated electronic assembly (typically a semiconductor IC chip) that comprises conductive means adapted for relatively high speed, low dispersion transmission of electrical signals. By relatively high speed we mean a signal propagation speed that is substantially (at least 25%, preferably 50% or even 100%) higher than that obtainable with analogous prior art conductor means. Preferably the signal propagation speed is at least about c/2, where c is the speed of light in vacuum.

More particularly, an electronic assembly according to the invention comprises a semiconductor substrate, insulating material and conductive means that signal-transmissively connect a first region (exemplarily a device such as a transistor) to a second region (exemplarily also a transistor, or input or output contact means) of the assembly. The conductive means comprise an elongate conductive body, exemplarily one (or possibly two parallel) metal lines. Typically the length of the elongate conductive body is at least about 100 $\mu$m, and can be one to several millimeters. The insulating material is disposed such that the elongate conductive body is spaced apart from the semiconductor substrate. Typically, over at least a portion of the length of the conductive body, the body is in contact with (and typically supported by) insulating material (e.g., $SiO_2$), and the insulating material in turn is in contact with (and typically supported by) the semiconductor substrate. Associated with the semiconductor substrate is a dielectric constant (whose value is readily available from a variety of sources), and associated with the conductive means is a length and an effective dielectric constant (whose value can, at least in principle, be calculated by known techniques).

Significantly, the semiconductor substrate comprises one or more recesses that are configured such that at least a portion of the insulating material (with the conductive means thereon) is spaced apart from the semiconductor substrate, such that the effective dielectric constant associated with at least a major portion of the length of the conductive means is substantially lower than the effective dielectric constant associated with an otherwise identical comparison assembly which does not comprise said recesses, and is furthermore substantially uniform over the portion. By a "major portion" of the length of the conductive means we mean at least 50% of the total length of the conductor connecting the first and second regions of the electronic assembly.

Detailed Description of Some Embodiments

Figure 1:
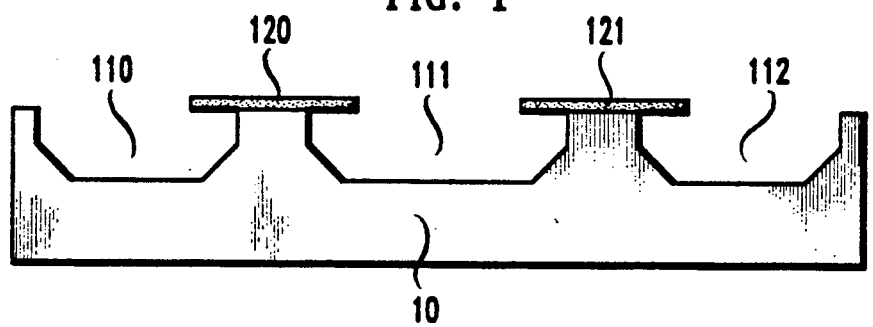
FIG. 1 schematically depicts an exemplary air gap transmission line.

FIG. 1 schematically depicts in cross section a co-planar transmission line which exhibits high signal speed. (By a "co-planar" transmission line we mean herein a transmission line having at least one conductor substantially at the level of the "front" surface of the semiconductor body.) However, it is relatively difficult to manufacture and for this reason it is not preferred. On semiconductor substrate 10 (e.g., semi-insulating InP) are formed two substantially parallel gold conductor lines 120 and 121 (e.g., 10 μm width, 1 μm thickness, 10 μm spacing). Such lines can readily be formed by conventional means. After deposition of an overlayer SiO$_2$ etch mask the substrate surface is etched in HCl, such that recesses 110, 111 and 112 (exemplarily 7 μm deep) are formed. The substrate portions that support the conductor lines are about 3 μm thick. This latter dimension is relatively difficult to control reliably.

Figure 2:
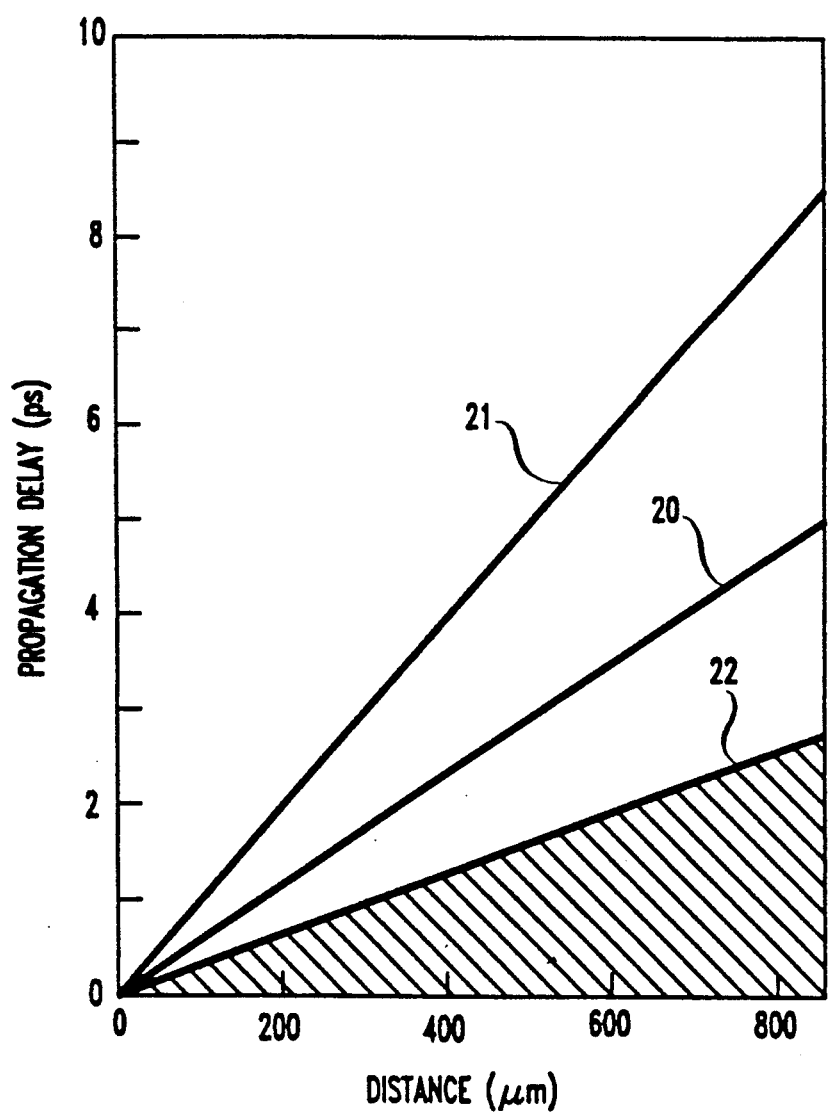
FIG. 2 shows exemplary data on propagation delay versus propagation distance for a transmission line as shown in FIG. 1.

Subsequent to the removal of the SiO$_2$ mask the pulse propagation speed on the thus formed co-planar air transmission line was measured by known means. Exemplary results are shown in FIG. 2, wherein line 20 pertains to an air transmission line as shown in FIG. 1, line 21 to an otherwise identical unetched comparison line, and line 22 represents propagation speed c. As can be seen from FIG. 2, the presence of the recesses in the semiconductor substrate resulted in a doubling of the propagation speed (to approximately 0.6 c). As will be apparent to those skilled in the art, only a small fraction of the field lines between the two (co-planar) conductors of the inventive line have to cross an air-dielectric interface. Thus, it can be expected that the transmission line of FIG. 1 does not only have high propagation speed but also relatively low dispersion. Those skilled in the art will also recognize that, since only a minor portion of the electric field associated with the transmission line of FIG. 1 exists in the (high dielectric constant) semiconductor material, the effective dielectric constant associated with the transmission line is relatively low, clearly substantially lower than the effective dielectric constant associated with the unetched comparison line.

The embodiments of the invention that are discussed below typically are more readily manufactured than the embodiment of FIG. 1, and for that reason are currently preferred.

Figure 3:
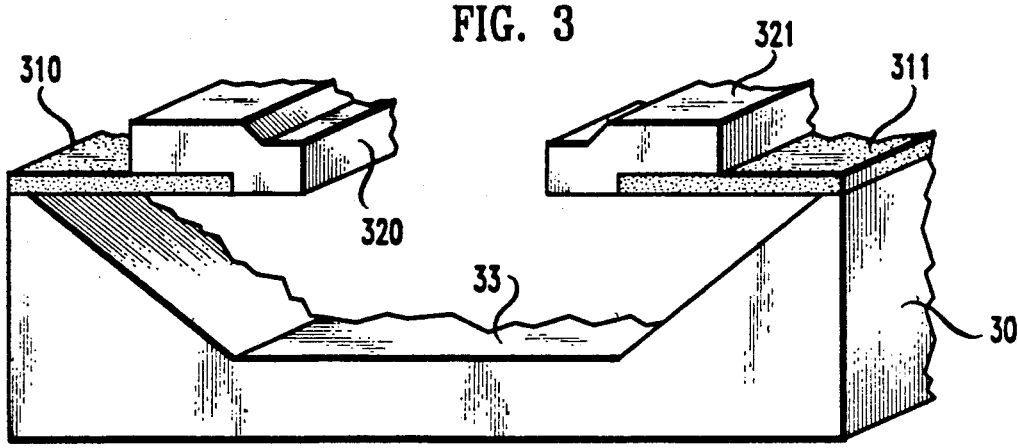
FIG. 3 schematically shows an air gap transmission line according to the invention.

FIG. 3 shows schematically a particular embodiment of the inventive transmission line, wherein numeral 30 refers to the semiconductor substrate (e.g., semi-insulating GaAs), numerals 310 and 311 to insulator material (e.g., 200 nm thick SiO$_2$), and numerals 320 and 321 to (co-planar) conductor lines (e.g., 1 μm thick and 5 μm wide Au lines). The gap between the conductors exemplarily is about 5 μm. Recess 33 can be produced by known means, e.g., by etching for 5 minutes in H$_2$O$_2$:H$_2$SO$_4$:40H$_2$O. The insulator material both acts as an etch mask and as support for the conductor lines. It will be appreciated that FIG. 3 (as well as FIGS. 1 and 7–10) shows only the relevant portion of an integrated electronic assembly according to the invention. Other portions can be conventional and are not shown. Exemplarily they contain a multiplicity of active devices (e.g., transistors), as well as passive devices (e.g., integrated resistors) and conventional conductor lines. The latter typically will be relatively short, exemplarily less than about 100 μm, if the inventive assembly is adapted for high frequency (e.g., at least 10 GHz, possibly more than 50 GHz) operation.

Figure 4:
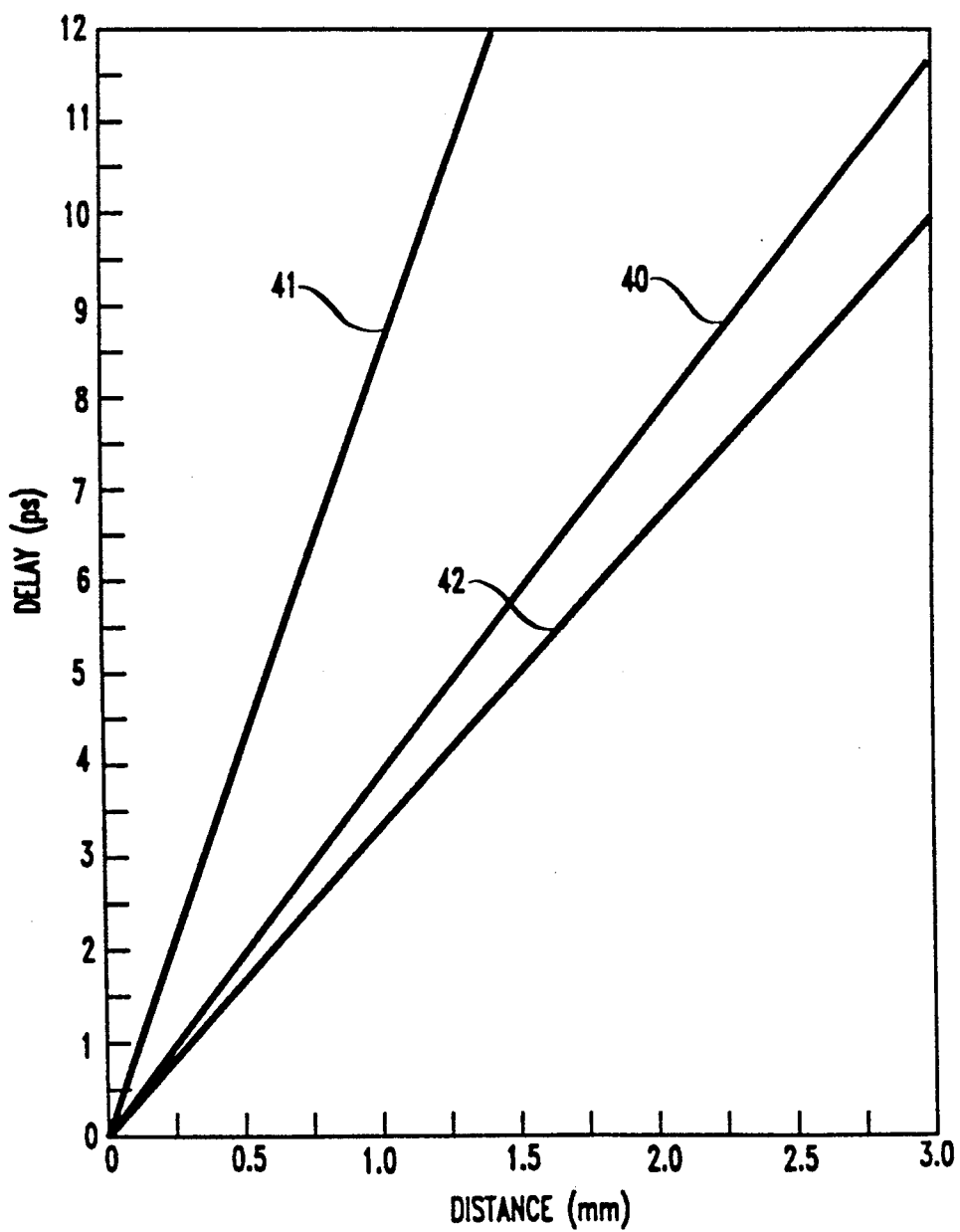
FIG. 4 gives exemplary data on propagation delay versus propagation distance for a transmission line as shown in FIG. 3.

FIG. 4 shows exemplary data on pulse delay versus propagation distance, with line 40 pertaining to an inventive transmission line according to FIG. 3, line 41 to an (otherwise identical) unetched comparison transmission line, and line 42 represents the speed of light (c). Lines 40 and 41 correspond to propagation velocities of 0.86 c and 0.39 c, respectively. The inventive transmission line thus has a propagation speed more than twice that of the (unetched) comparison line.

Since approximately half of the electric field associated with the unetched transmission line is present in the semiconductor, the propagation speed of the unetched line is approximately $c/\sqrt{\epsilon_{av}}$, where $\epsilon_{av}=(\epsilon+\epsilon_o)/2$ is the effective dielectric constant associated with the unetched transmission line, with $\epsilon$ being the static dielectric constant of the semiconductor (12.85 for GaAs), and $\epsilon_o$ being the dielectric constant of vacuum (and air), namely 1. For a GaAs substrate this gives a propagation speed of 0.38 c, in good agreement with the measured propagation speed. Using a similar approach, one can calculate that $\epsilon_{av}$ of the inventive transmission line of FIGS. 3 and 4 is 1.35. Thus, the effective dielectric constant associated with the exemplary inventive transmission line clearly is much less than the dielectric constant of the unetched comparison line.

Figure 6:
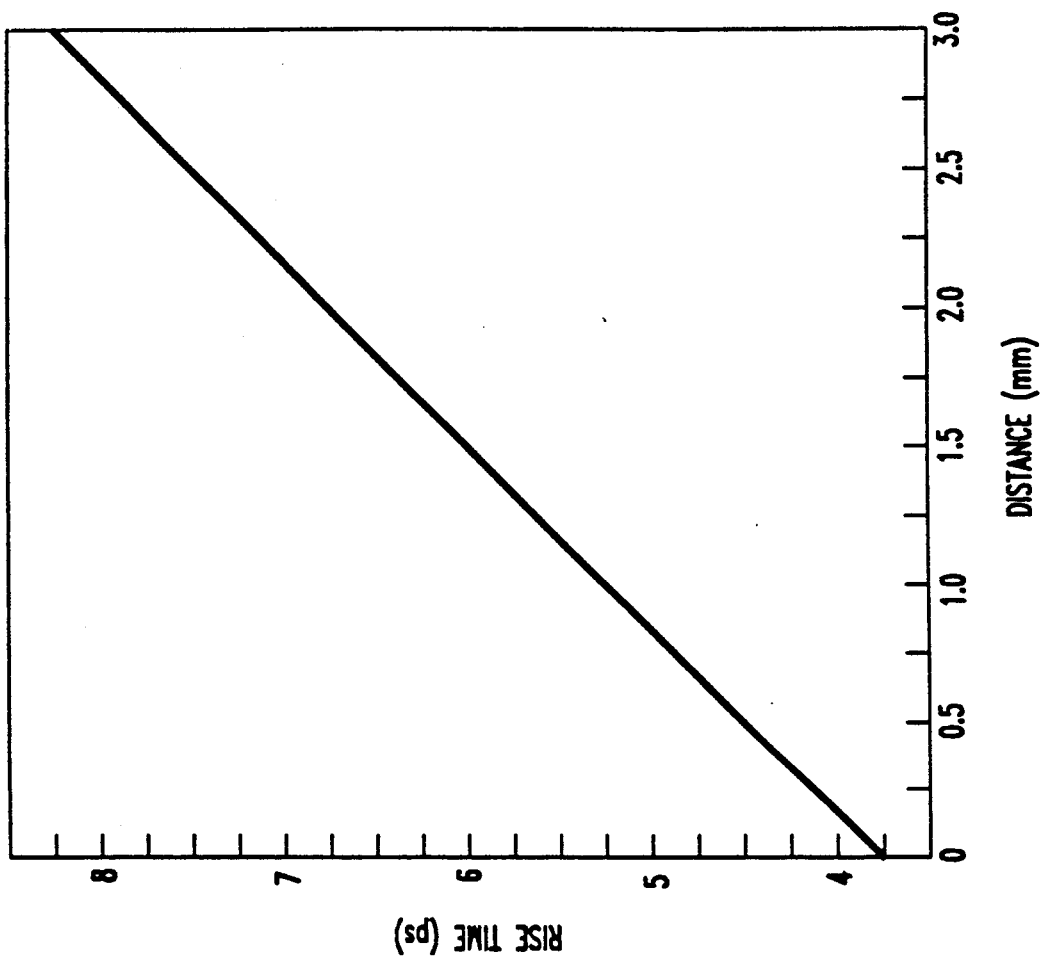
FIG. 6 gives exemplary data on pulse risetime versus propagation distance for a line as shown in FIG. 3.
Figure 5:
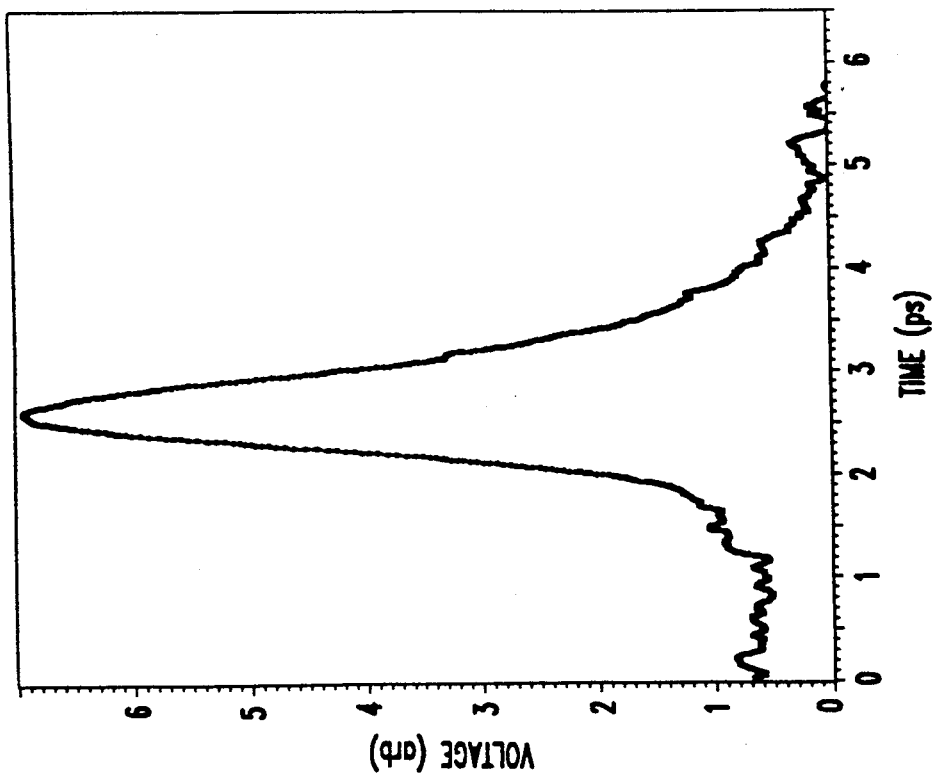
FIG. 5 shows a pulse shape after 75 μm of propagation on a line as shown in FIG. 3.

Only a relatively small fraction of the field lines associated with the transmission line of FIG. 3 cross an air-dielectric interface. Thus it can be expected that pulse shape will be relatively well preserved in such a transmission line. FIG. 5 shows a test pulse after 75 μm of propagation, and FIG. 6 shows the pulse rise time as a function of propagation distance. The data shows that a pulse having initial risetime of 0.37 ps still has only 0.8 ps risetime after 3 mm propagation, indicative of low dispersion.

Figure 7:
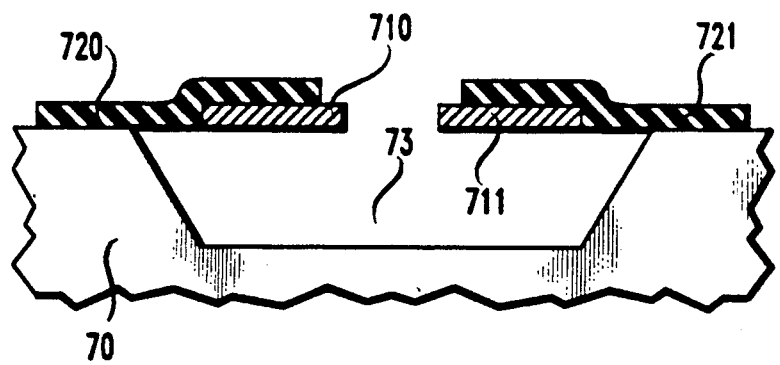
FIGS. 7–10 schematically depict further exemplary embodiments of transmission lines according to the invention.

The invention can be embodied in a variety of other geometries, as will be apparent to those skilled in the art. For instance, FIG. 7 schematically shows a transmission line according to the invention that comprises a semiconductor (e.g., Si) substrate 70 with a recess 73 therein, with conductor lines 710 and 711 supported (and partially overlain) by insulators 720 and 721, respectively. Optionally the insulators can comprise "windows" (not shown) that can serve to improve etching of the recess.

Figure 8:
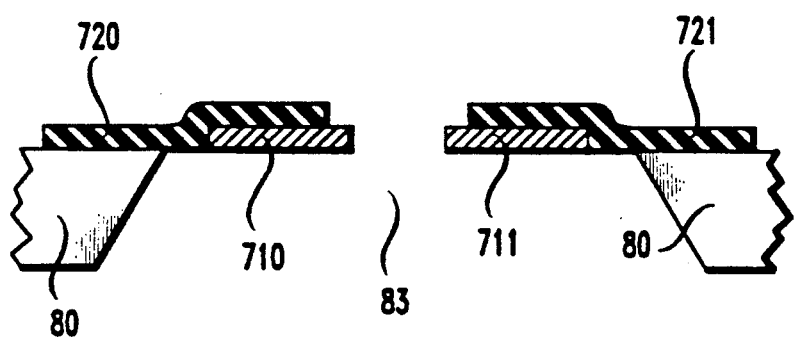

A further exemplary geometry is schematically shown in FIG. 8, wherein recess 83 extends from the "back" of substrate 80 to the transmission line.

Figure 9:
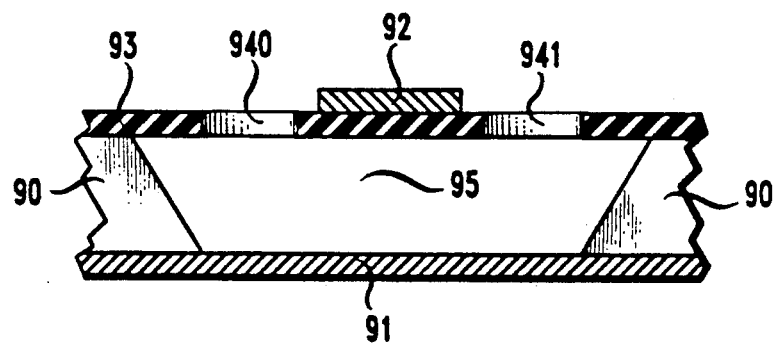

A still further exemplary geometry is schematically depicted in FIG. 9. This embodiment comprises a conductive backplane 91 on substrate 90, with recess 95 optionally extending completely through the substrate. Single conductor 92 is supported by insulator layer 93. "Windows" 940 and 941 in 93 permit etch access. In a variant of the embodiment of FIG. 9 an axial strip is opened through 93, with 92 extending over the opened strip.

Figure 10:
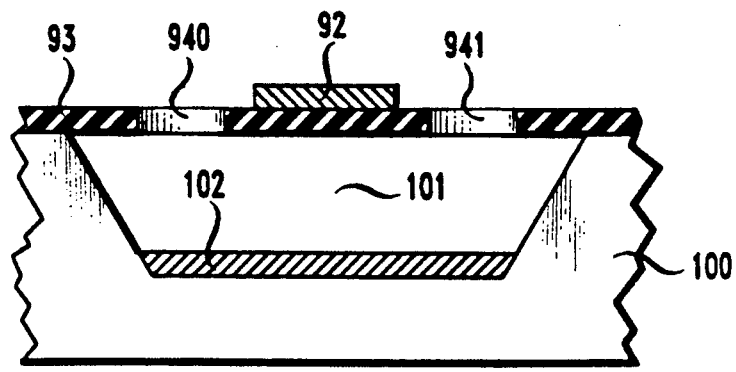

FIG. 10 shows a still further exemplary geometry, wherein recess 101 extends only part-way through semiconductor substrate 100, with conductor 102 forming the bottom electrode of the transmission line. The bottom electrode can, for instance, be formed by angle evaporation through the "windows" in the insulator layer 93, as will be apparent to those skilled in the art.

Those skilled in the art also will recognize that the invention is not limited to metal conductor bodies, and that any other material of acceptable conductivity [including metal silicide, as well as "low $T_c$" and "high $T_c$" (e.g., $YBa_2Cu_3O_7$) superconductor] can be used in the practice of the invention. Furthermore, the invention is not limited to the use of a semiconductor substrate. For instance, it is known that $SrTiO_3$ is an advantageous substrate for $YBa_2Cu_3O_7$ films, and high $T_c$ superconductor co-planar air gap transmission lines on metal oxide substrates, or on an oxide buffer layer on a semiconductor substrate, are contemplated.

We claim:

1. Integrated electronic assembly comprising (i) a semiconductor substrate having a first major surface and a second major surface that is substantially parallel to the first major surface; (ii) insulating material; and (iii) conductive means that signal-transmissively connect a first and second region of the assembly, the first region being spaced apart from the second region; wherein the conductive means comprise an elongate conductive body that is in contact with the insulating material, the insulating material is disposed such that the elongate conductive body is spaced apart from the semiconductor substrate, and associated with the conductive means are an effective dielectric constant and a length; characterized in that the semiconductor substrate comprises a recess or recesses configured such that at least a portion of the insulating material is spaced apart from the semiconductor substrate, such that the effective dielectric constant associated with at least a major portion of the length of the conductive means is substantially uniform and substantially lower than an effective dielectric constant associated with the conductive means of a comparison electronic assembly that is identical to said integrated electronic assembly except that the comparison assembly's semiconductor substrate does not comprise any recesses.

2. The assembly of claim 1, wherein said insulating material is in contact with the first major surface, and wherein at least one recess extends from the first major surface towards the second major surface.

3. The assembly of claim 1, wherein said insulating material is in contact with the first major surface, and wherein at least one recess extends through the substrate from the second major surface to the first major surface.

4. The assembly of claim 1, wherein the conductive means comprise at least two elongate, essentially co-planar conductive bodies with a gap between the two bodies, the two bodies being substantially at the level of the first major surface.

5. The assembly of claim 1, wherein the elongate conductive body is substantially at the level of the first major surface, and wherein the assembly further comprises a second conductive body, spaced apart from the elongate conductive body, that is at a level between the first and second major surfaces or is substantially at the level of the second major surface.

6. The assembly of claim 5, wherein at least one recess extends from the first major surface towards the second major surface, wherein said insulating material is in contact with the first major surface and comprises apertures that extend through the insulating material, and wherein said second conductive body is disposed in said at least one recess.

7. The assembly of claim 1, wherein the elongate conductive body comprises superconducting material.

8. The assembly of claim 7, wherein the superconducting material has nominal composition $YBa_2Cu_3O_7$.

* * * * *